United States Patent [19]
Kitajima

[11] Patent Number: 5,396,099
[45] Date of Patent: Mar. 7, 1995

[54] MOS TYPE SEMICONDUCTOR DEVICE HAVING A HIGH ON CURRENT/OFF CURRENT RATIO

[75] Inventor: Hiroshi Kitajima, Tokyo, Japan

[73] Assignee: NEC Corporation, Tokyo, Japan

[21] Appl. No.: 795,736

[22] Filed: Nov. 21, 1991

[30] Foreign Application Priority Data

Nov. 28, 1990 [JP] Japan ................. 2-327916

[51] Int. Cl.[6] ............ H01L 27/01; H01L 29/04; H01L 31/036; H01L 27/12
[52] U.S. Cl. ................. 257/347; 257/66; 257/72; 257/350; 257/352
[58] Field of Search ............... 357/23.7, 2, 4; 257/66, 257/72, 347, 350, 352, 57, 59

[56] References Cited

U.S. PATENT DOCUMENTS

| | | |
|---|---|---|
| 4,425,572 | 1/1984 | Takafuji et al. .............. 357/23.7 |
| 4,715,930 | 12/1987 | Diem ........................... 357/23.7 |
| 4,880,753 | 11/1989 | Meakin et al. ............... 357/23.7 |

FOREIGN PATENT DOCUMENTS

| | | |
|---|---|---|
| 54-130883 | 10/1979 | Japan ............... 357/23.7 |
| 55-29136 | 3/1980 | Japan ............... 357/23.7 |
| 55-74176 | 6/1980 | Japan ............... 357/23.7 |
| 55-74177 | 6/1980 | Japan ............... 357/23.7 |
| 1-39065 | 2/1989 | Japan ............... 357/23.7 |
| 1-155663 | 6/1989 | Japan ............... 357/23.7 |

*Primary Examiner*—Steven Ho Yin Loke
*Attorney, Agent, or Firm*—Burns, Doane, Swecker & Mathis

[57] ABSTRACT

A MOS type semiconductor device includes a thin-film semiconductor, a gate oxide film, and a gate. The thin-film semiconductor has a drain region, a source region, and a channel region arranged between these two regions. The gate oxide film is formed on the thin-film semiconductor. The gate is formed in correspondence with the channel region via the gate oxide film. The thin-film semiconductor is formed such that the film thickness of the drain region and the source region is made smaller than the film thickness of the channel region.

6 Claims, 4 Drawing Sheets

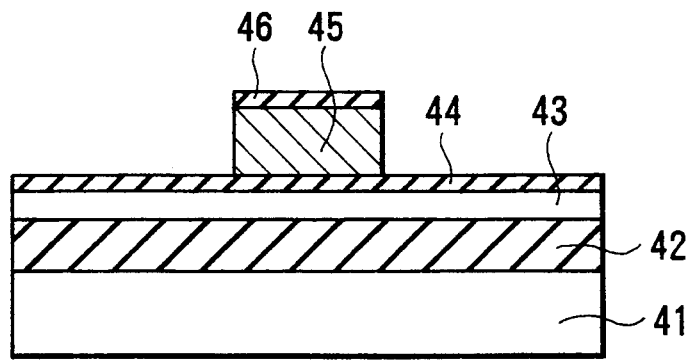
F I G. 3A
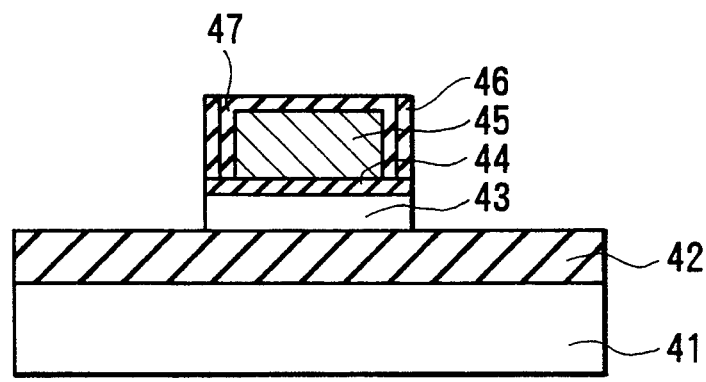
F I G. 3B
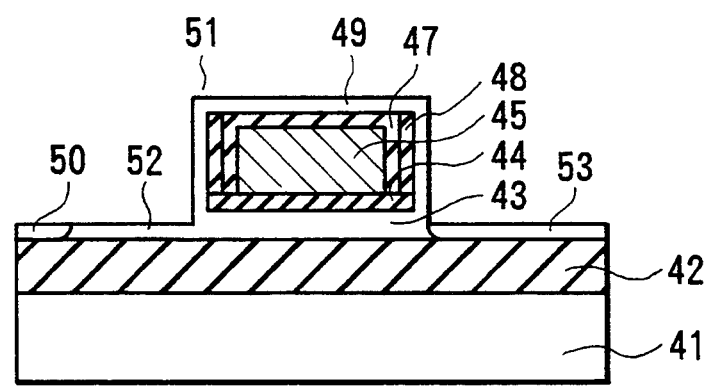
F I G. 3C

MOS TYPE SEMICONDUCTOR DEVICE HAVING A HIGH ON CURRENT/OFF CURRENT RATIO

BACKGROUND OF THE INVENTION

The present invention relates to the structure of a MOS (Metal Oxide Semiconductor) type semiconductor device and, more particularly, to the structure of a thin-film MOS transistor on an insulating film.

The structures of conventional polycrystalline silicon thin-film transistors are shown in sectional views of FIGS. 4 and 5.

An oxide film 62 is formed on a silicon substrate 61, and a polycrystalline silicon thin film 63 is deposited on it. The crystallinity, particularly the mean grain size of the polycrystalline silicon thin film 63 has a large effect on transistor characteristics. Therefore, the process is often performed such that amorphous silicon is deposited first and then annealing is performed at a temperature of about 600° C. for a long time to increase the grain size. Thereafter, the polycrystalline silicon thin film 63 is patterned by a photolithographic technique and an ion etching technique, and a gate oxide film 64 is formed on its surface. The formation of the gate oxide film 64 is accomplished by thermally oxidizing the surface of the polycrystalline silicon thin film 63 or by depositing a silicon oxide film by a chemical deposition method. Thereafter, polycrystalline silicon is deposited on the entire surface, and phosphorus, for example, is heavily doped in the polycrystalline silicon by a diffusion method or an ion implantation method. Subsequently, by using the photolithographic technique and the ion etching technique, patterning is performed to form a polycrystalline silicon gate 65. A source region 66 and a drain region 67 are formed in the polycrystalline silicon thin film 63 by ion implantation of arsenic, and this results in a basic structure of a polycrystalline silicon thin-film transistor. The structure shown in FIG. 4 is called a top gate type structure because the gate 65 is present on top of the polycrystalline silicon thin film 63 for forming a conductive channel region.

On the other hand, formation of a polycrystalline silicon gate 73 is performed first, and then a gate oxide film 74 and a polycrystalline silicon thin film 75 are formed in sequence. The result is the structure shown in FIG. 5. In FIG. 5, reference numeral 76 denotes a source region; and 77, a drain region.

In contrast to the structure of FIG. 4, the structure of FIG. 5 is called a bottom gate type structure for the gate 73 is present on the bottom of the polycrystalline silicon thin film 75.

The polycrystalline silicon thin-film transistor is poorer in characteristics than a single-crystal transistor because its conductive channel region consists of polycrystalline silicon. It is said that this degradation in characteristics is primarily caused by grain boundaries in polycrystalline silicon. Increasing the grain size is effective in decreasing the density of the grain boundaries. When the increase in grain size is achieved to a certain extent, however, characteristics, particularly a leakage current in an OFF state, is largely influenced by a distribution of grain boundaries in the p-n junction of a transistor. To decrease the area of the p-n junction is effective, and therefore to reduce a film thickness of the polycrystalline silicon thin film 75 is an effective means to decrease the leakage current. However, the decrease in film thickness of the polycrystalline silicon thin film 75 as a whole introduces problems, for example, reduction in ON current or degradation in subthreshold characteristic.

SUMMARY OF THE INVENTION

It is an object of the present invention to provide a MOS type semiconductor device which improves the characteristics of a thin-film transistor.

It is another object of the present invention to provide a MOS type semiconductor device which prevents reduction in ON current or improves subthreshold characteristics.

It is still another object of the present invention to provide a MOS type semiconductor device which reduces an OFF current.

It is still another object of the present invention to provide a MOS type semiconductor device which improves an ON current/OFF current ratio.

In order to achieve the above objects of the present invention, there is provided a MOS type semiconductor device comprising a thin-film semiconductor having a drain region, a source region, and a channel region arranged between the drain and source regions, a gate oxide film formed on the thin-film semiconductor, and a gate formed in correspondence with the channel region via the gate oxide film, wherein the thin-film semiconductor is formed such that the film thickness of the drain region and the source region is made smaller than the film thickness of the channel region.

BRIEF DESCRIPTION OF THE DRAWINGS

FIGS. 3A to 3A to 3C are longitudinal sectional views showing still another embodiment of the present invention.

DETAILED DESCRIPTION OF THE PREFERRED EMBODIMENTS

Preferred embodiments of the present invention will be described in detail below.

Figure 1A:
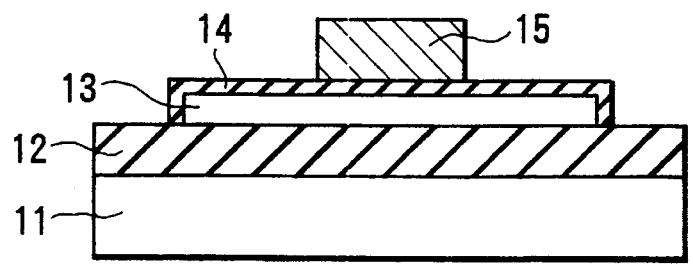
FIGS. 1A and 1B are longitudinal sectional views showing an embodiment of a semiconductor device according to the present invention.
Figure 1B:
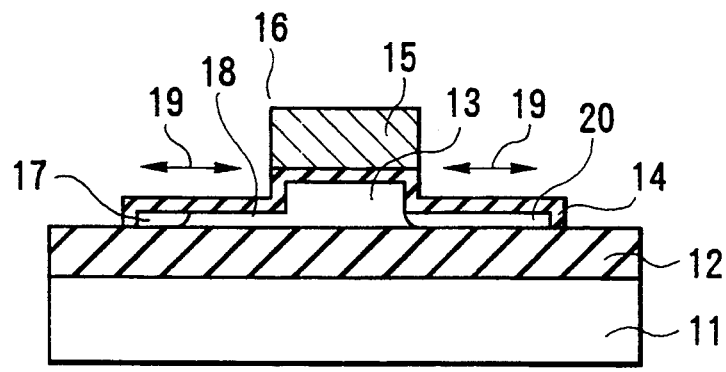

FIGS. 1A and 1B illustrate the process of fabricating an embodiment according to the present invention.

Figure 4:
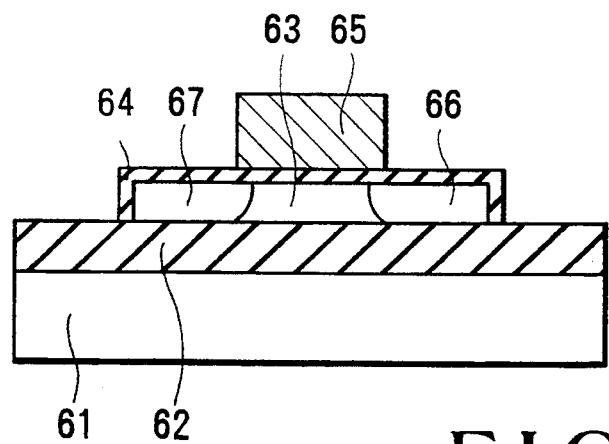
FIGS. 4 and 5 are sectional views showing conventional semiconductor devices.
Figure 5:
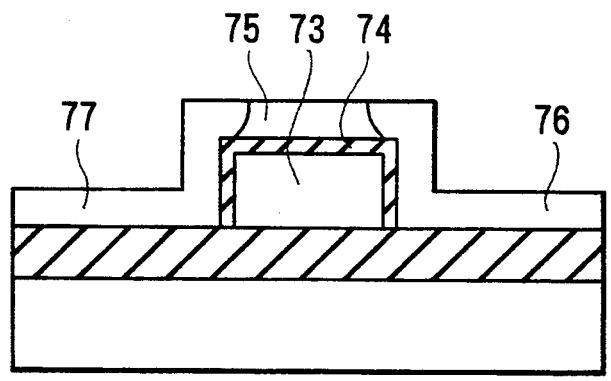

FIG. 1A shows a state in which patterning of a polycrystalline silicon gate is finished in the same fashion as in a conventional structure of FIG. 4. That is, a polycrystalline silicon thin film 13 serving as a conductive portion and a thermal oxide film 14 are formed in sequence on a silicon oxide film 12 formed on a silicon substrate 11. In addition, a polycrystalline silicon film 15 as a gate is formed on the thermal oxide film 14. The grain size of the polycrystalline silicon thin film 13 for forming a conductive channel region is increased by depositing an amorphous silicon thin film and performing annealing at about 600° C. for a long time.

Subsequently, the thermal oxide film 14 is etched away by anisotropic etching using the polycrystalline silicon gate 15 as a mask (it is of course possible to perform this step subsequent to pattering of the polycrystalline silicon gate 15), thus further decreasing the thickness of the polycrystalline silicon thin film 13 by the etching. In order to form a source region 20 and a drain region 17, an impurity is heavily ion-implanted. In this case, the drain region 17 is separated from the polycrystalline silicon thin film 13 corresponding to the gate end 16, i.e., a region 18 where no impurity is ion-implanted is formed between the drain region 17 and the gate end 16. This state is shown in FIG. 1B. The region 18 mitigates the electric field at the drain end. However, in order to form the drain region 17, by taking into account also diffusion of the impurity, in a region 19 formed by further decreasing the thickness of polycrystalline silicon thin film 13, it is essential to form the region 18 where no impurity is ion-implanted. This process makes it possible to form a thin-film transistor in which the thickness of a region at the drain end where a p-n junction is formed is smaller than the thickness of the polycrystalline silicon thin film 13 below the gate oxide film 14. This structure realizes a thin-film transistor in which an OFF current is proportional to or less than a film thickness whereas an ON current or a subthreshold characteristic remains nearly unchanged, compared with the case in which no thin film formation is performed at the drain end portion.

FIGS. 2A to 2D illustrate the process of fabrication of another embodiment according to the present invention.

Figure 2A:
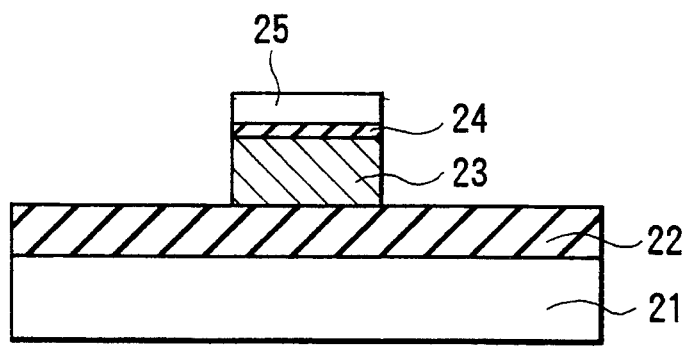
FIGS. 2A, 2A, 2D, and 2D are longitudinal sectional views showing another embodiment of the present invention.
Figure 2B:
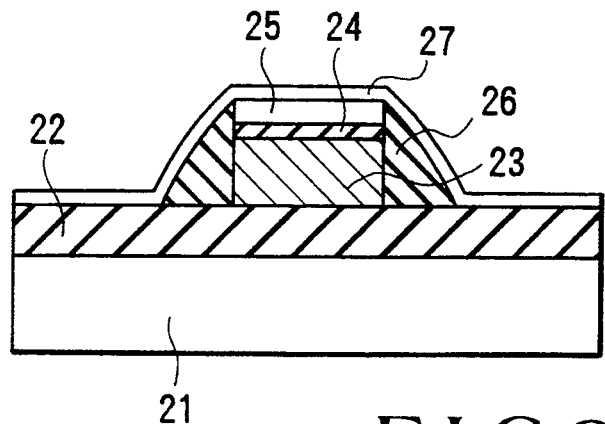
FIG. 2C is a plan view of this embodiment.
Figure 2C:
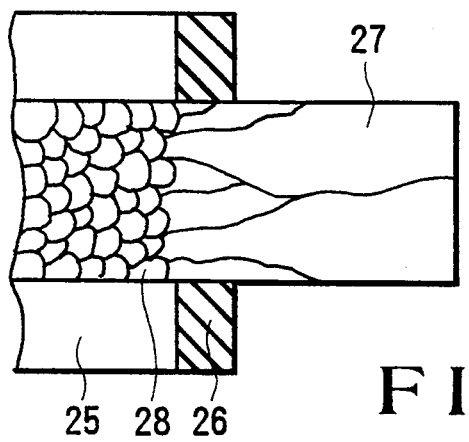
Figure 2D:
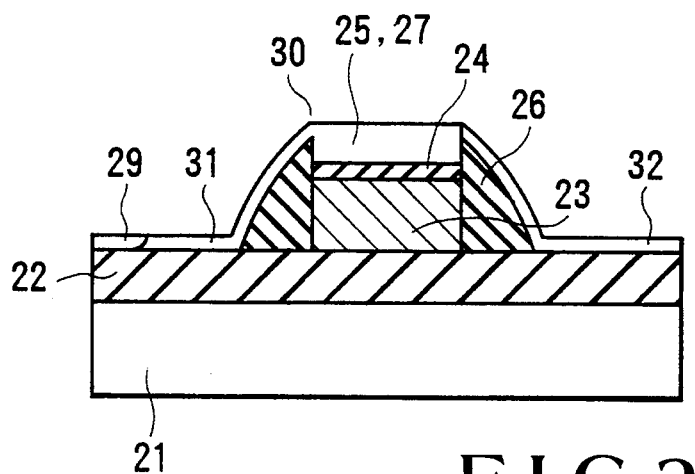

After a thermal oxide film 22 is formed on a silicon substrate 21, a polycrystalline silicon film 23 is deposited. An impurity is introduced in the polycrystalline silicon film 23 by either diffusion or ion implantation, thus decreasing the resistance of the film. A silicon oxide film 24 serving as a gate insulating film is formed on the surface of the polycrystalline silicon film 23, and subsequently an amorphous silicon thin film is deposited. By performing annealing at a temperature of about 600° C. for a long time, the amorphous silicon thin film is altered into a polycrystalline silicon thin film 25 having a large grain size. Thereafter, patterning is performed on the polycrystalline silicon film 23 using a photolithographic technique and an ion etching technique. The resultant state is shown in FIG. 2A. Subsequently, a silicon oxide film 26 is deposited, and anisotropic ion etching is performed to leave the silicon oxide film 26 only on the side surfaces of the polycrystalline silicon film 23. Thereafter, an amorphous silicon thin film is deposited on the entire surface, and annealing is performed at a temperature of about 600° C. for a long time to alter the film into a polycrystalline silicon thin film 27 having a large grain size. This state is shown in FIG. 2B. In this case, crystallization of the amorphous silicon thin film occurs from a portion in contact with the polycrystalline silicon thin film 25 already having the increased grain size. As a result, an increase in grain size is conspicuous compared with crystallization at random in such a manner that the grain size is increased as the position is separated from an end portion 28 of the polycrystalline silicon thin film 25. FIG. 2C shows the resultant planar structure. Similar to the first embodiment, a source region 32 and a drain region 29 are formed so as to form a region 32 where no impurity is ion-implanted between the drain region 29 and the polycrystalline silicon thin film 27 corresponding to the gate end 30. This state is shown in FIG. 2D. This process makes it possible to form a thin-film transistor in which the thickness of a region at the drain end where a p-n junction is formed is smaller than the thickness of the polycrystalline silicon thin film 25 on the gate oxide film 24. In this thin film transistor, a decrease in OFF current is notable compared with a conventional structure which yields an ON current or a subthreshold characteristic of about the same grade as this structure. The end portion 27 of the polycrystalline silicon thin film 25 already having the increased grain size is used as a seed to perform crystallization of the region at the drain end where a p-n junction is formed. Therefore, the grain size in this region is increased larger than in the case of the first embodiment, and the result is that the effect of decreasing an OFF current is further enhanced.

FIGS. 3A to 3C illustrate the process of fabrication of still another embodiment according to the present invention.

This embodiment is an example of performing the two-step crystallization as in the second embodiment for a top gate type.

An amorphous silicon thin film is deposited on an oxide film 42 formed on a silicon substrate 41, and annealing is performed at a temperature of about 600° C. for a long time to alter the thin film into a polycrystalline silicon thin film 43 having a large grain size. A gate oxide film 44 is formed on the surface of the thin film 43, and a polycrystalline silicon film 45 is deposited. After phosphorus, for example, is heavily doped in the polycrystalline silicon by a diffusion method or an ion implantation method, a silicon oxide film 46 is formed on the entire surface. Subsequently, patterning is performed to the polycrystalline silicon thin film 45 using a photolithographic technique and an ion etching technique. The resultant state is shown in FIG. 3A. Thereafter, a silicon oxide film 47 is formed on top and the side surfaces of the polycrystalline silicon thin film 45. Silicon nitride 48 is deposited on the entire surface, and anisotropic ion etching is performed to leave the silicon nitride 48 only on the side surfaces. The polycrystalline silicon thin film 45 is used as a mask to etch away the gate oxide film 44 and the polycrystalline silicon thin film 43 by the anisotropic ion etching. This state is shown in FIG. 3B. Thereafter, an amorphous silicon thin film is deposited on the entire surface, and annealing is performed at a temperature of about 600° C. for a long time to alter the thin film into a polycrystalline silicon thin film 49 having a large grain size. In this case, the crystallization of the amorphous silicon thin film starts from a portion in contact with the polycrystalline silicon thin film 43 already having the increased grain size. As a result, the increase in grain size is remarkable compared with crystallization at random such that the grain size is increased as the position is separated from the end portion of the polycrystalline silicon thin film 43.

As in the first and second embodiments, a source 53 and a drain region 50 are formed so as to form a region 52 where no impurity is ion-implanted is formed between the drain region 50 and the polycrystalline silicon thin film 43 corresponding to the gate end 51. The resultant state is shown in FIG. 3C.

In this structure, a decrease in OFF current is notable compared with a conventional structure which yields an ON current or a subthreshold characteristic of about the same grade as this structure. The end portion of the polycrystalline silicon thin film 43 already having the increased grain size is used as a seed to perform the crystallization of a region at the drain end where a p-n junction is formed. The result is a large grain size in this region, as in the second embodiment. Therefore, the effect of decreasing an OFF current is more conspicuous than the thin film formation of the drain end.

According to the present invention as has been described above, a thin-film portion except for a silicon thin film in contact with a gate oxide film, particularly a thin-film portion at a drain end is smaller in thickness than the silicon thin film. As a result, thin-film transistor characteristics are improved. In addition, an OFF current can be decreased compared with a conventional structure which yields an ON current or a subthreshold characteristic of about the same grade as this structure. When two-step crystallization is employed, together with independent control of the film thickness of a region where a p-n junction of a drain portion is formed, an OFF current can be reduced by at least about 10 times. Therefore, compared with a conventional structure, an ON/OFF ratio is improved by about 10 times.

What is claimed is:

1. A MOS type semiconductor device comprising:
   a first thin-film semiconductor having a drain region, a source region, and a channel region arranged between said drain and source region;
   a gate oxide film formed adjacent to said thin-film semiconductor;
   a gate formed in correspondence with said channel region via said gate oxide film; and
   a region, where no impurity is ion-implanted, formed at least between and drain region and said channel region corresponding to an end portion of said gate along a conductive channel direction,
   wherein said first thin-film semiconductor is formed such that a film thickness of said drain region, and said source region is made smaller than a film thickness of said channel region and is formed on a silicon substrate via an insulating film.

2. A device according to claim 1, wherein said MOS type semiconductor device is of a top gate type in which said first thin film semiconductor, said gate oxide film, and said gate are stacked in this order on said insulating film.

3. A device according to claim 1, wherein said MOS type semiconductor device is of a bottom gate type in which said gate, said gate oxide film, and said first thin-film semiconductor are stacked in this order on said insulating film.

4. A device according to claim 1, wherein said first thin-film semiconductor, said gate oxide film, said gate and a second thin-film semiconductor, which is insulated from said gate, is in contact with said first thin-film semiconductor, and has a large grain size, are stacked in this order on the insulating film.

5. A MOS type semiconductor device comprising:
   a first thin-film semiconductor having a drain region, a source region, and a channel region arranged between said drain region and said source region;
   a gate oxide film formed adjacent to said first thin-film semiconductor;
   a gate formed in correspondence with said channel region via said gate oxide film; and
   a region, where no impurity is ion-implanted, formed at least between said drain region and said channel region corresponding to an end portion of said gate along a conductive channel direction,
   wherein said first thin-film semiconductor is formed such that a film thickness of said drain region, and said source region is made smaller than a film thickness of said channel region and is a polycrystalline silicon thin film having a large grain size.

6. A MOS type semiconductor device comprising:
   thin-film semiconductor having a drain region, a source region, and a channel region arranged between said drain region and said source region;
   a gate oxide film formed adjacent to said first thin-film semiconductor;
   a gate formed in correspondence with said channel region via said gate oxide film; and
   a non-implanted region, where no impurity is ion-implanted in said thin film semiconductor, formed at least between said drain region and said channel region corresponding to an end portion of said gate along a conductive channel direction
   wherein a film thickness of said drain region, said source region, and said non-implanted region is made smaller than a film thickness of said channel region.

* * * * *